(12) United States Patent
Park et al.

(10) Patent No.: US 10,566,473 B2
(45) Date of Patent: Feb. 18, 2020

(54) COMPOUND SEMICONDUCTOR SOLAR CELL AND METHOD OF MANUFACTURING THE SAME

(71) Applicant: LG ELECTRONICS INC., Seoul (KR)

(72) Inventors: Jinhee Park, Seoul (KR); Soohyun Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/961,006

(22) Filed: Apr. 24, 2018

(65) Prior Publication Data

US 2018/0308996 A1 Oct. 25, 2018

(30) Foreign Application Priority Data

Apr. 25, 2017 (KR) ........................ 10-2017-0053002

(51) Int. Cl.
*H01L 31/0224* (2006.01)
*H01L 21/02* (2006.01)
(Continued)

(52) U.S. Cl.
CPC ............... *H01L 31/022433* (2013.01); *H01L 31/022425* (2013.01); *H01L 31/0304* (2013.01);
(Continued)

(58) Field of Classification Search
CPC .......... H01L 31/022433; H01L 31/184; H01L 31/0735; H01L 31/0304; H01L 31/0693;
(Continued)

(56) References Cited

U.S. PATENT DOCUMENTS

| 6,278,054 B1 * | 8/2001 | Ho ........................ H01L 31/046 136/255 |
| 6,806,172 B1 * | 10/2004 | Woo ...................... H01L 21/324 257/385 |
| 2014/0360567 A1 * | 12/2014 | Seutter ................... H01B 1/023 136/256 |

FOREIGN PATENT DOCUMENTS

| JP | 8-274358 A | 10/1996 |
| JP | 2004-186499 A | 7/2004 |

(Continued)

*Primary Examiner* — Michael Y Sun
(74) *Attorney, Agent, or Firm* — Birch, Stewart, Kolasch & Birch, LLP

(57) ABSTRACT

A compound semiconductor solar cell and a method of manufacturing the same are disclosed. The method for fabricating a compound semiconductor solar cell comprises forming a first mask layer on a front surface of a compound semiconductor layer of a second region which is a region other than a first region where the front electrode is to be formed; forming a seed metal layer on the front surface of the compound semiconductor layer of the first region and on the first mask layer of the second region; removing the seed metal layer over the first mask layer and the first mask layer; removing a part of the compound semiconductor layer of the second region from the front surface of the compound semiconductor layer by using the seed metal layer of the first region as a mask; forming a second mask layer on the compound semiconductor layer of the second region; forming an electrode metal layer on the seed metal layer not covered by the second mask layer; and removing the second mask layer.

12 Claims, 4 Drawing Sheets

(51) Int. Cl.
| | | |
|---|---|---|
| *H01L 31/0735* | (2012.01) | |
| *H01L 31/18* | (2006.01) | |
| *H01L 31/0693* | (2012.01) | |
| *H01L 31/0304* | (2006.01) | |
| *H01L 21/027* | (2006.01) | |
| *H01L 21/033* | (2006.01) | |
| *H01L 21/311* | (2006.01) | |
| *H01L 21/3213* | (2006.01) | |
| *H01L 21/308* | (2006.01) | |
| *H01L 21/266* | (2006.01) | |
| *H01L 21/3105* | (2006.01) | |
| *H01L 21/04* | (2006.01) | |
| *H01L 21/768* | (2006.01) | |
| *H01L 21/475* | (2006.01) | |

(52) U.S. Cl.
CPC ...... *H01L 31/0693* (2013.01); *H01L 31/0735* (2013.01); *H01L 31/184* (2013.01); *H01L 21/027* (2013.01); *H01L 21/0268* (2013.01); *H01L 21/0274* (2013.01); *H01L 21/0275* (2013.01); *H01L 21/0278* (2013.01); *H01L 21/02642* (2013.01); *H01L 21/02645* (2013.01); *H01L 21/02647* (2013.01); *H01L 21/02678* (2013.01); *H01L 21/033* (2013.01); *H01L 21/0335* (2013.01); *H01L 21/0337* (2013.01); *H01L 21/0338* (2013.01); *H01L 21/0465* (2013.01); *H01L 21/266* (2013.01); *H01L 21/308* (2013.01); *H01L 21/3086* (2013.01); *H01L 21/31056* (2013.01); *H01L 21/31144* (2013.01); *H01L 21/32139* (2013.01); *H01L 21/475* (2013.01); *H01L 21/768* (2013.01); *H01L 21/7688* (2013.01); *Y02E 10/544* (2013.01); *Y02P 70/521* (2015.11)

(58) Field of Classification Search
CPC ......... H01L 31/022425; H01L 21/7688; H01L 21/475; H01L 21/768; H01L 21/033; H01L 21/0465; H01L 21/308; H01L 21/31056; H01L 21/266; H01L 21/3086; H01L 21/32139; H01L 21/31144; H01L 21/0274; H01L 21/0278; H01L 21/0275; H01L 21/0337; H01L 21/0335; H01L 21/0338; H01L 21/02642; H01L 21/02678; H01L 21/027; H01L 21/0268; H01L 21/02647; H01L 21/02645; H01L 31/1844; H01L 31/18; H01L 31/0392; H01L 31/03046; H01L 31/02366; Y02E 10/544; Y02P 70/521
See application file for complete search history.

(56) References Cited

FOREIGN PATENT DOCUMENTS

| | | |
|---|---|---|
| JP | 2010-157655 A | 7/2010 |
| JP | 2010157655 A * | 7/2010 |
| KR | 10-1193809 B1 | 10/2012 |
| KR | 20140029590 A * | 3/2014 |
| KR | 10-1486206 B1 | 1/2015 |

* cited by examiner

COMPOUND SEMICONDUCTOR SOLAR CELL AND METHOD OF MANUFACTURING THE SAME

CROSS-REFERENCE TO RELATED APPLICATION

This application claims priority to and the benefit of Korean Patent Application No. 10-2017-0053002 filed in the Korean Intellectual Property Office on Apr. 25, 2017, the entire contents of which are incorporated herein by reference.

BACKGROUND OF THE INVENTION

Field of the Invention

The present disclosure relates to a compound semiconductor solar cell and a method of manufacturing the same, and more particularly to a compound semiconductor solar cell having a front electrode capable of lowering the manufacturing cost while preventing damage and degradation of the compound semiconductor layer, and a method of manufacturing the same.

Description of the Related Art

A compound semiconductor solar cell includes a compound semiconductor layer formed of various layers using a III-V compound semiconductor such as gallium arsenide (GaAs), indium phosphide (InP), gallium aluminum arsenide (GaAlAs) and gallium indium arsenide (GaInAs), a II-VI compound semiconductor such as cadmium sulfide (CdS), cadmium telluride (CdTe) and zinc sulfide (ZnS), a compound semiconductor such as copper indium selenide ($CuInSe_2$), and the like. A grid-shaped front electrode is positioned on a front surface of the compound semiconductor layer and a back electrode of a sheet shape is positioned on a back surface of the compound semiconductor layer.

In producing the compound semiconductor solar cell having such a structure, the front electrode including a seed metal layer and an electrode metal layer is formed by a plurality of mask processes. Then, an etching process using a solution (acid/base) is performed to pattern a layer located at the top of the compound semiconductor layer in the same grid pattern as the front electrode. At this time, the material of the electrode metal layer, gold (Au) superior in corrosion resistance to hydrofluoric acid (HF) used in the above solution (acid/base) and ELO (epitaxial lift off) process is mainly used.

However, since gold (Au) forming the electrode metal layer is very expensive, it is very difficult to lower the manufacturing cost of the compound semiconductor solar cell.

Therefore, studies have been made to form the electrode metal layer from metals other than gold (Au). In recent years, studies have been made to form the electrode metal layer using copper (Cu), which is much cheaper in material cost than gold (Au).

However, when the electrode metal layer is formed of copper, there is a problem that the electrode metal layer is etched due to the solution (acid/base), and the compound semiconductor layer is dissolved by the copper plating solution when plating the electrode metal layer.

Accordingly, there is a need for a novel method of forming the electrode metal layer with copper while preventing the above-mentioned problems.

SUMMARY OF THE INVENTION

The present disclosure provides a compound semiconductor solar cell having a front electrode capable of lowering the manufacturing cost while preventing damage and degradation of the compound semiconductor layer, and a method of manufacturing the same.

In one aspect, there is provided a method for fabricating a compound semiconductor solar cell, comprising: forming a first mask layer on a front surface of a compound semiconductor layer of a second region which is a region other than a first region where the front electrode is to be formed; forming a seed metal layer on the front surface of the compound semiconductor layer of the first region and on the first mask layer of the second region; removing the seed metal layer over the first mask layer and the first mask layer; removing a part of the compound semiconductor layer of the second region from the front surface of the compound semiconductor layer by using the seed metal layer of the first region as a mask; forming a second mask layer on the compound semiconductor layer of the second region; forming an electrode metal layer on the seed metal layer not covered by the second mask layer; and removing the second mask layer.

In the step of forming the second mask layer, a width of an opening exposing the seed metal layer may be formed narrower than a width of the seed metal layer.

At this time, the width of the opening may be set to 70% to 97% of the width of the seed metal layer, and the width of the electrode metal layer may be set to 70% to 97% of the width of the seed metal layer.

In the step of forming the second mask layer, the second mask layer may cover both ends in the width direction of the seed metal layer, respectively.

The seed metal layer may be formed by depositing any one material selected from the group consisting of palladium (Pd), nickel (Ni), titanium (Ti), platinum (Pt), and silver (Ag) or an alloy thereof to a thickness of 5 nm to 100 nm by physical vapor deposition.

The electrode metal layer may be formed by plating copper (Cu) to a thickness of 1 μm to 30 μm by a plating method.

A cover metal layer including at least one of chromium (Cr), molybdenum (Mo), nickel (Ni), silver (Ag), and titanium (Ti) may be formed on the electrode metal layer.

In the step of removing the compound semiconductor layer, a front contact layer which is in direct contact with the seed metal layer and located at the top of the compound semiconductor layer may be removed.

The front contact layer may be formed of n-type or p-type GaAs, and may be removed by using a mixed solution of ammonia water ($NH_4OH$)/hydrogen peroxide ($H_2O_2$)/DI water or by using a mixture of phosphorous acid ($H_3PO_3$)/hydrogen peroxide ($H_2O_2$)/DI water.

A window layer in direct contact with a back surface of the front contact layer may be formed of a III-V compound semiconductor containing phosphide (P).

In one aspect, there is provided a compound semiconductor solar cell, comprising: a compound semiconductor layer; and a front electrode of a grid shape positioned on a front surface of the compound semiconductor layer, wherein the front electrode includes a seed metal layer that is in direct contact with the compound semiconductor layer and has a first width, and an electrode metal layer that is formed on the seed metal layer and has a second width smaller than the first width.

At this time, the second width of the electrode metal layer may be formed to 70% to 97% of the first width of the seed metal layer.

Both end portions of the seed metal layer may be positioned outside the width direction of the electrode metal layer.

The seed metal layer may include any one material selected from the group consisting of palladium (Pd), nickel (Ni), titanium (Ti), platinum (Pt), and silver (Ag), and a thickness of the seed metal layer may be 5 nm to 100 nm.

The electrode metal layer may include copper (Cu) and may be formed to a thickness of 1 μm to 30 μm.

A cover metal layer may be positioned on the electrode metal layer and may include at least one of chromium (Cr), molybdenum (Mo), nickel (Ni), silver (Ag), and titanium (Ti).

The front contact layer may be formed of n-type or p-type GaAs at the top of the compound semiconductor layer and may have the same grid-like shape as the front electrode. A window layer directly contacting a back surface of the front contact layer may be formed under the front contact layer, and may be formed of a III-V compound semiconductor containing phosphide.

According to the method for manufacturing a compound semiconductor solar cell according to the present invention, the front contact layer positioned at the top of the compound semiconductor layer is patterned using the seed metal layer as a mask before forming the electrode metal layer on the seed metal layer. Thus, it is possible to prevent a part of the electrode metal layer from being etched in the process of patterning the front contact layer even if the electrode metal layer is formed of copper (Cu) which is very cheap in material cost.

Since the second mask layer for forming the electrode metal layer covers both ends of the seed metal layer in the width direction of the seed metal layer, it is possible to prevent the compound semiconductor layer from being dissolved by the copper plating solution during the formation of the electrode metal layer by plating the copper.

Therefore, there is an effect that the damage and performance deterioration of the compound semiconductor layer can be prevented while the material of the front electrode is made of copper which is much cheaper in material cost than gold (Au).

DETAILED DESCRIPTION OF THE EMBODIMENTS

Figure 1:
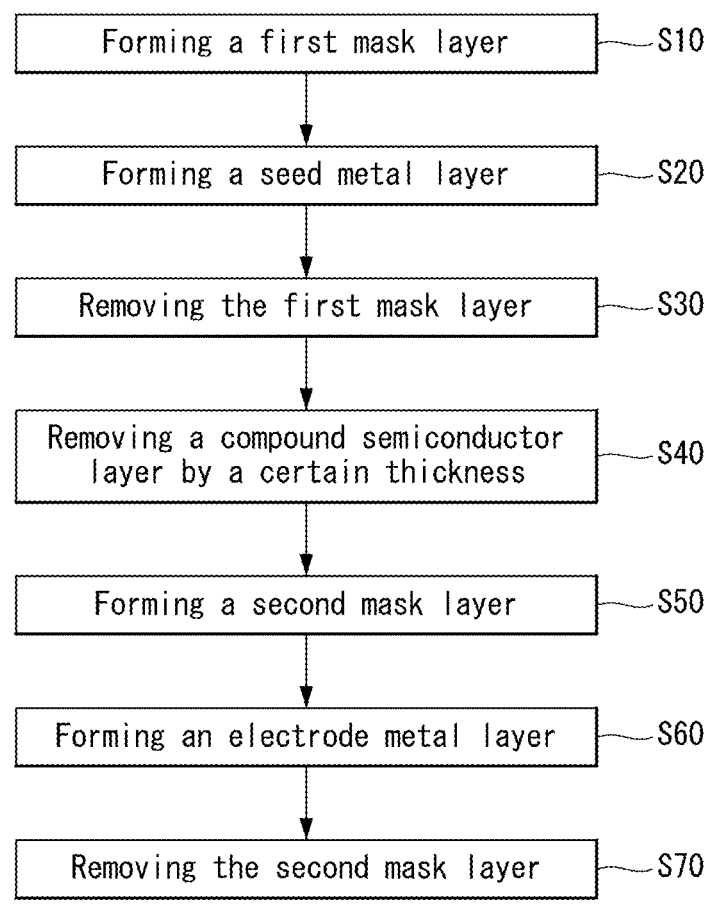
FIG. 1 is a block diagram showing a method of manufacturing a compound semiconductor solar cell according to the present invention.

Reference will now be made in detail embodiments of the disclosure examples of which are illustrated in the accompanying drawings. Since the present disclosure may be modified in various ways and may have various forms, specific embodiments are illustrated in the drawings and are described in detail in the present specification. However, it should be understood that the present disclosure are not limited to specific disclosed embodiments, but include all modifications, equivalents and substitutes included within the spirit and technical scope of the present disclosure.

The terms "first", "second", etc. may be used to describe various components, but the components are not limited by such terms. The terms are used only for the purpose of distinguishing one component from other components.

For example, a first component may be designated as a second component, and a second component may be designated as a first component without departing from the scope of the present disclosure.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component.

On the other hand, when an arbitrary component is described as "being directly connected to" or "being directly linked to" another component, this should be understood to mean that no component exists between them.

The terms used in the present application are used to describe only specific embodiments or examples, and are not intended to limit the present disclosure. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Unless otherwise specified, all of the terms which are used herein, including the technical or scientific terms, have the same meanings as those that are generally understood by a person having ordinary knowledge in the art to which the present disclosure pertains.

The terms defined in a generally used dictionary must be understood to have meanings identical to those used in the context of a related art, and are not to be construed to have ideal or excessively formal meanings unless they are obviously specified in the present application.

The following example embodiments of the present disclosure are provided to those skilled in the art in order to describe the present disclosure more completely. Accordingly, shapes and sizes of elements shown in the drawings may be exaggerated for clarity.

Hereinafter, embodiments of the disclosure are described with reference to FIGS. 1 to 5.

Figure 2:
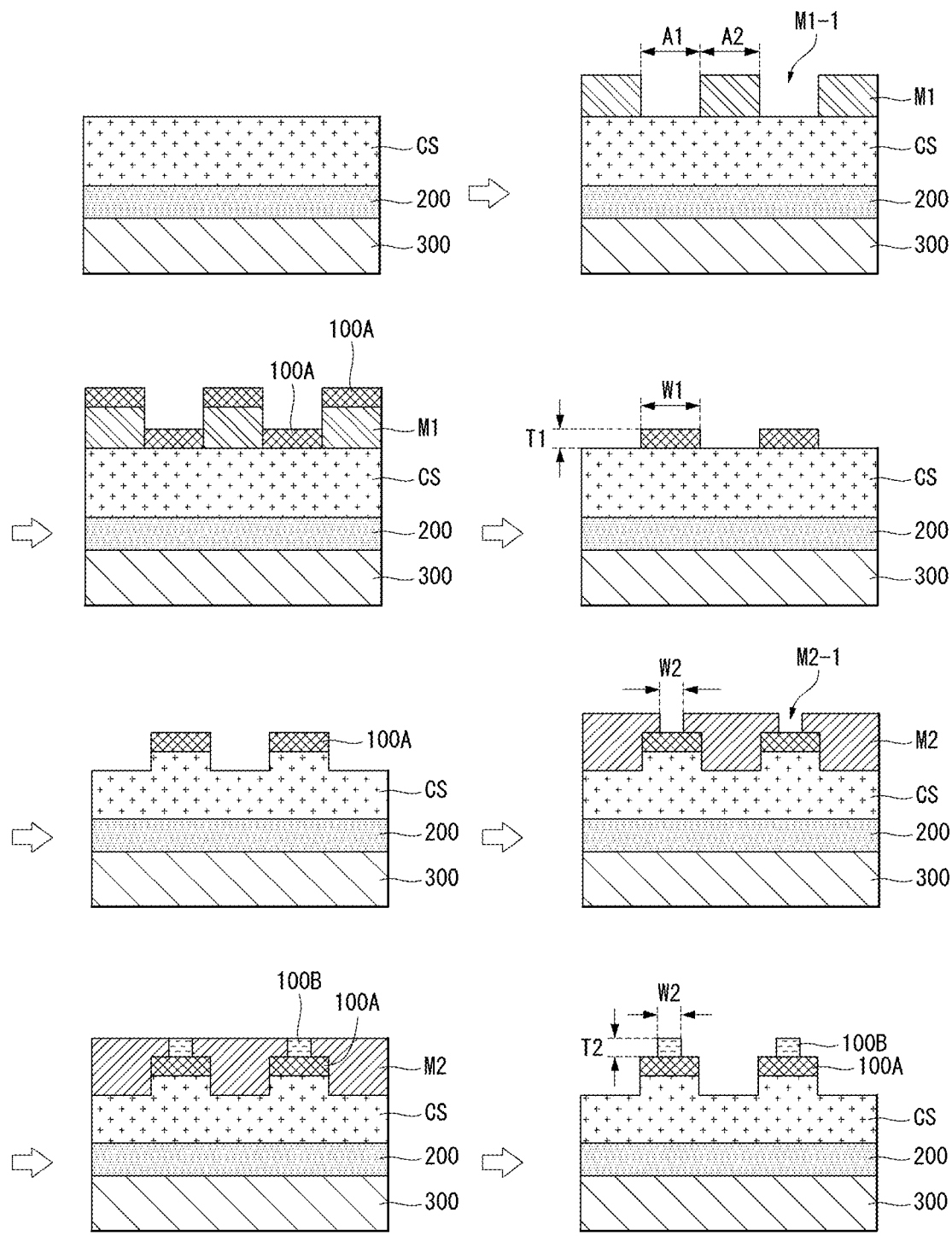
FIG. 2 is a process chart showing the manufacturing method shown in FIG. 1.
Figure 3:
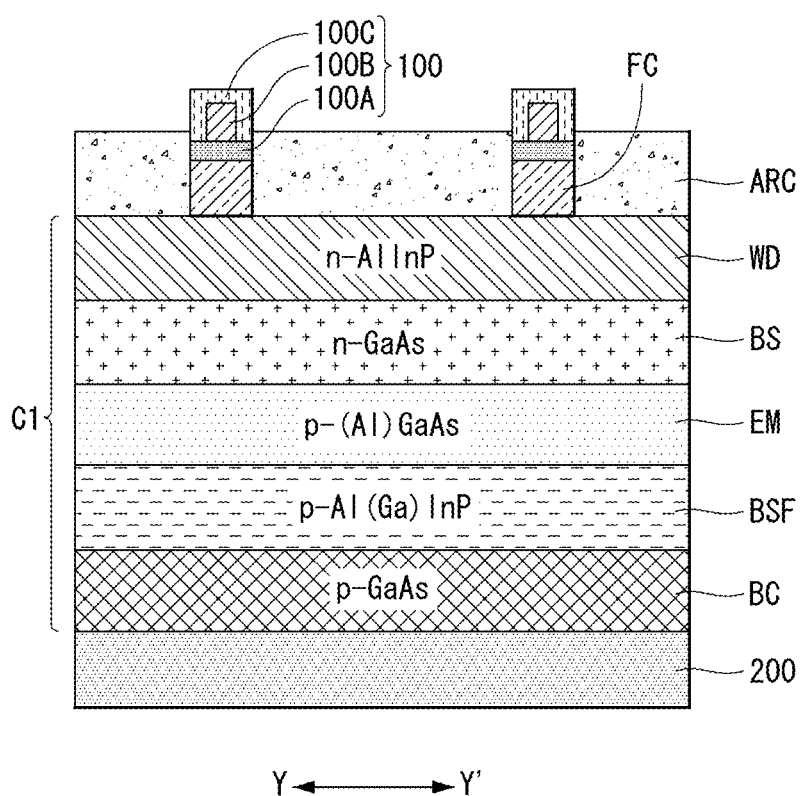
FIG. 3 is a sectional view of a compound semiconductor solar cell manufactured by the manufacturing method shown in FIG. 1.

FIG. 1 is a block diagram showing a method of manufacturing a compound semiconductor solar cell according to the present invention. FIG. 2 is a process chart showing the manufacturing method shown in FIG. 1. FIG. 3 is a sectional view of a compound semiconductor solar cell manufactured by the manufacturing method shown in FIG. 1.

First, a compound semiconductor solar cell manufactured by the manufacturing method of the present invention will be described with reference to FIG. 3.

The compound semiconductor solar cell comprises a compound semiconductor layer CS formed of a III-VI compound semiconductor, a grid-shaped front electrode 100 positioned on a front surface of the compound semiconductor layer CS, and a sheet-shaped back electrode 200 positioned on a back surface of the compound semiconductor layer CS.

Here, the compound semiconductor layer CS may include a window layer WD positioned on a light receiving surface, a base layer BS positioned on a back surface of the window layer WD and containing an impurity of a first conductivity type, an emitter layer EM positioned on a back surface of the base layer BS and containing an impurity of a second conductive type opposite to the first conductive type, a back surface field layer BSF positioned on a back surface of the emitter layer EM, a front contact layer FC positioned on a front surface of the window layer WD and a back contact layer BC positioned on a back surface of the back surface field layer BSF.

The compound semiconductor solar cell may further include an antireflection layer (ARC) covering the window layer WD.

At least one of the antireflection layer ARC, the window layer WD, the front contact layer FC and the back contact layer BC may be omitted. However, as shown in FIG. 3, a case where the compound semiconductor solar cell includes both the antireflection layer ARC, the window layer WD, the front contact layer FC and the back contact layer BC will be described as an example.

The base layer BS and the emitter layer EM may be formed to include a III-VI group compound semiconductor.

For example, the base layer BS and the emitter layer EM may be formed of a GaInP-based compound containing gallium (Ga), indium (In) and phosphide (P), or may be formed of GaAs-based compound containing gallium (Ga) and arsenide (As).

Hereinafter, the case where the base layer BS and the emitter layer EM are formed of a GaAs-based compound semiconductor will be described as an example.

The base layer BS may contain an impurity of the first conductivity type, for example an n-type impurity, and the emitter layer EM may comprise an impurity of the second conductivity type opposite to the first conductivity type, for example p type impurities.

The doping concentrations of the impurities contained in the base layer BS and the emitter layer EM are uniform in the thickness direction of the corresponding layer. Alternatively, the doping concentration of the impurities contained in the base layer BS and the emitter layer EM may increase as the distance from the emitter layer EM increases in the thickness direction of the corresponding layer.

When the first and second impurity doping concentrations vary in the thickness direction within the corresponding layer, the impurity doping concentration may be a step type, a logarithm type, an exponential type, or linear type.

As an example, the base layer BS may be formed of n-GaAs, and the emitter layer EM may be formed of p-(Al)GaAs.

The p-type impurity doped in the emitter layer EM may be selected from carbon (C), magnesium (Mg), zinc (Zn), or a combination thereof, and an n-type impurity may be selected from silicon (Si), selenium (Se), tellurium (Te), or combinations thereof.

The base layer BS may be positioned in an area adjacent to a front electrode 100 and the emitter layer EM may be positioned in an area immediately below the base layer BS and adjacent to a back electrode 200.

That is, the distance between the base layer BS and the front electrode 100 is smaller than the distance between the emitter layer EM and the front electrode 100, and the distance between the base layer BS and the back electrode 200 is larger than the distance between the emitter layer EM and the back electrode 200.

Therefore, the compound semiconductor solar cell of the embodiment can have a rear emitter structure in which the emitter layer EM is located on a rear surface of the base layer BS.

According to this configuration, the electron-hole pairs generated by the light incident at the base layer BS are electrically decoupled to each other by the internal potential difference formed by the p-n junction between the emitter layer EM and the base layer BS. Electrons move to the n-type, and holes move to the p-type.

Therefore, holes, which are a minor carrier generated inside the base layer BS, moves to the back electrode 200 through the back surface field layer BSF and the back contact layer BC. Electrons, which are majority carriers generated in the base layer BS, move to the front electrode 100 through the window layer WD and the front contact layer FC.

Alternatively, when the emitter layer EM is located in the region adjacent to the front electrode 100 and the base layer BS is located in the region adjacent to the back electrode 200 immediately below the emitter layer EM, holes move to the front electrode 100 through the window layer WD and the front contact layer FC and electrons move to the back electrode 200 through the back surface field layer BSF and the back contact layer BC.

The back surface field layer BSF has the same conductivity type as the top layer directly contacting, ie, the emitter layer EM, and may be formed of p-Al(Ga)InP, for example.

In order to effectively block charge (electrons) to be moved toward the front electrode 100 toward the rear electrode 200, the front layer BSF is formed entirely on the rear surface of the emitter layer EM.

The window layer WD is formed between the base layer BS and the front electrode 100 and serves to passivate the front surface of the base layer BS.

Therefore, when majority carriers (electrons) move to the surface of the base layer BS, the window layer WD can prevent majority carriers from recombining on the surface of the base layer BS.

Since the window layer WD is disposed on the front surface of the base layer BS (i.e., light incident surface), in order to allow a large amount of light to be incident on the base layer BS, the window layer WD needs to have an energy band gap higher than the energy band gap of the base layer BS.

Therefore, the window layer WD can be formed of n-AlInP having a band gap of approximately 2.3 eV.

The antireflection layer ARC may be positioned in a region other than a region where the front electrode 100 and/or the front contact layer FC are located in the front surface of the window layer WD.

Alternatively, the antireflection layer ARC may be disposed on the front contact layer FC and the front electrode 100 as well as the exposed window layer WD.

The compound semiconductor solar cell may further include a bus bar electrode physically connecting the plurality of front electrodes 100, and the bus bar electrode may be exposed to the outside without being covered by the antireflection layer ARC.

The antireflection film may include magnesium fluoride, zinc sulfide, titanium oxide, silicon oxide, derivatives thereof, or a combination thereof.

The front electrode 100 may be formed to extend in the first direction and may be spaced apart at regular intervals along a second direction Y-Y' orthogonal to the first direction.

The front electrode 100 may include a seed metal layer 100A, an electrode metal layer 100B, and a cover metal layer 100C. The seed metal layer 100A may be formed by depositing any one material selected from palladium (Pd), nickel (Ni), titanium (Ti), platinum (Pt), silver (Ag), and an alloy thereof with a thickness T1 of 5 nm to 100 nm. The electrode metal layer 100B may be formed by plating copper (Cu) on the seed metal layer 20A with a thickness of 1 µm to 30 µm. The cover metal layer 100C may be formed by depositing at least one material of chromium (Cr), molybdenum (Mo), nickel (Ni), silver (Ag), and titanium (Ti).

The seed metal layer 100A may have a first width W1 and the electrode metal layer 100B may have a second width W2 that is smaller than the first width W1. The cover metal layer 100C may be formed to cover the upper surface and side surfaces of the electrode metal layer 100B.

The second width W2 of the electrode metal layer 100B may be 70% to 97% of the first width W1 of the seed metal layer 100A. That is, the electrode metal layer 100B may be formed to have a width smaller by about 3% to 30% than the seed metal layer 100A.

Both ends of the seed metal layer 100A may be located on the outside of the electrode metal layer 100B in the width direction (Y-Y' direction) of the electrode metal layer 100B.

At this time, the widths of both ends of the seed metal layer 100A located on both sides of the electrode metal layer 100B may be equal to each other or may be different from each other.

According to this configuration, the electrode metal layer 100B is substantially entirely overlapped with the seed metal layer 100A on the projection plane.

As described above, the cross-sectional shape of the front electrode 100 in which the second width W2 of the electrode metal layer 100B is formed to be smaller than the first width W1 of the seed metal layer 100A is can be obtained only when the manufacturing method of the present invention is used. That is, the cross-sectional shape of the front electrode 100 is obtained only when the electrode metal layer 100B is formed by plating copper on the seed metal layer 100A after the front contact layer FC is etched using the seed metal layer 100A as a mask.

In the case where the front contact layer FC is patterned using a solution after the electrode metal layer is formed by plating copper (Cu) on the seed metal layer, part of the electrode metal layer is etched by the solution. Thus, the bottom width of the electrode metal layer is reduced as compared with the top width as shown in the left side of FIG. 4.

Therefore, the resistance of the electrode metal layer is increased, and the charges moved to the front electrode cannot be collected well.

Figure 5:
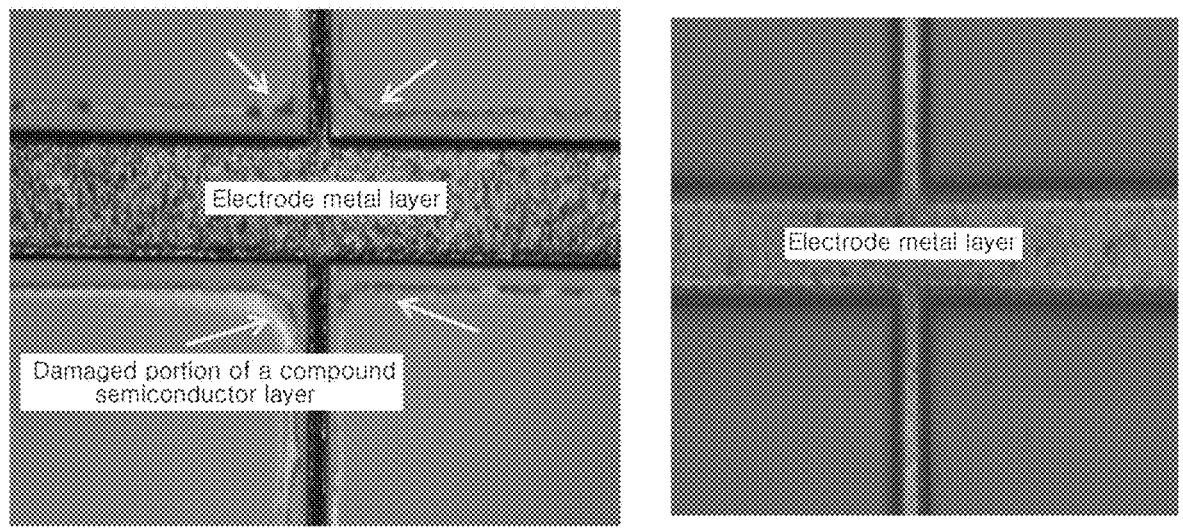
FIG. 5 is a front view of a compound semiconductor solar cell in the case of patterning the front contact layer after forming the electrode metal layer with copper and patterning the front contact layer and then forming the electrode metal layer with copper.

Also, during the formation of the electrode metal layer by plating the copper, part of the compound semiconductor layer is dissolved by the copper plating solution, and the damaged portion of the compound semiconductor layer is generated as indicated by the arrow in the left side of FIG. 5.

Figure 4:
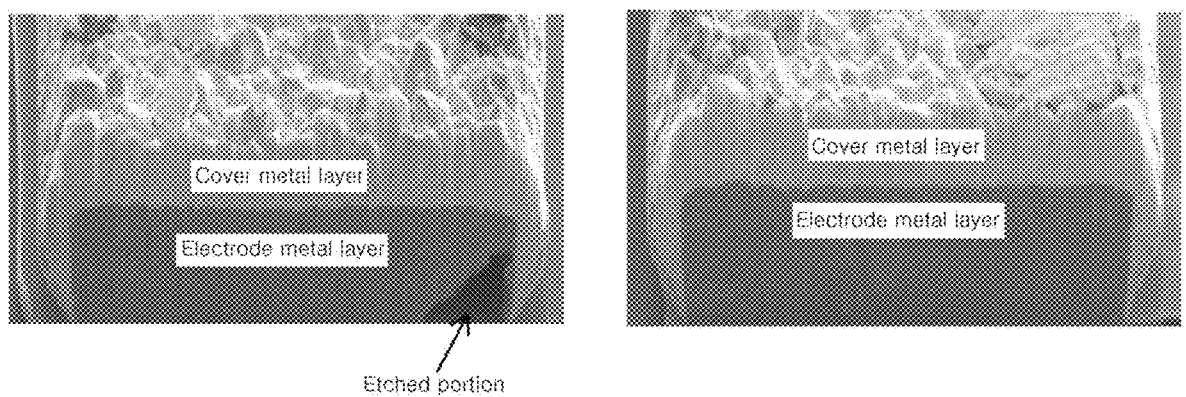
FIG. 4 is a cross-sectional view of a front electrode of a compound semiconductor solar cell in the case of patterning the front contact layer after forming the electrode metal layer with copper and patterning the front contact layer and then forming the electrode metal layer with copper.

However, referring to the right side of FIGS. 4 and 5, when the compound semiconductor solar cell is manufactured by the manufacturing method according to the embodiment of the present invention, it is possible to keep the bottom width equal to the top surface width and to prevent the compound semiconductor layer from being damaged by the copper plating solution.

Therefore, it is possible to prevent damage to the compound semiconductor layer and deterioration in performance, while forming the material of the front electrode from copper that is much cheaper in material cost than gold (Au).

The front contact layer FC positioned between the window layer WD and the front electrode 100 can be formed by doping an n-type impurity with a doping concentration higher than that of the base layer BS to the group III-VI compound semiconductor. As an example, the front contact layer FC may be formed of n+-GaAs.

The front contact layer FC forms an ohmic contact between the window layer WD and the front electrode 100. Namely, when the front electrode 100 directly contacts the window layer WD, an ohmic contact between the front electrode 100 and the base layer BS is not satisfactorily formed due to the low impurity doping concentration of the window layer WD. Thus, carriers moving to the window layer WD cannot easily move to the front electrode 100 and may be disappeared.

However, when the front contact layer FC is formed between the window layer WD and the front electrode 100, a movement of carriers can be smoothly performed by the front contact layer FC forming the ohmic contact together with the front electrode 100. Thus, a short circuit current density Jsc of the compound semiconductor solar cell can increase, and the efficiency of the compound semiconductor solar cell can be further improved.

The front contact layer FC may be formed in the same grid shape as the front electrode 100.

The back contact layer BC positioned on the back surface of the back surface field layer BSF is entirely positioned on the back surface of the back surface field layer BSF and may be formed by doping a p-type impurity to the group III-VI compound semiconductor. As an example, the back contact layer BC may be formed of p-GaAs.

The back contact layer BC can form an ohmic contact with the back electrode 200, and the short circuit current density Jsc of the compound semiconductor solar cell can be further improved. Thus, the efficiency of the solar cell can be further improved.

A thickness of the front contact layer FC and a thickness of the back contact layer BC may each be 100 nm to 300 nm. For example, the front contact layer FC may be formed to a thickness of 100 nm, and the back contact layer BC may be formed to a thickness of 300 nm.

The back electrode 200 on the back surface of the back contact layer BC may be formed using a sheet-shaped conductor positioned on the entire back surface of the back contact layer BC, unlike the front electrode 100. Namely, the back electrode 200 may be referred to as a sheet electrode positioned on the entire back surface of the back contact layer BC.

In this instance, the back electrode 200 may have the same planar area as the base layer BS. The back electrode 200 may be formed as a single layer or a plurality of layers including at least one selected from gold (Au), platinum (Pt), titanium (Ti), tungsten (W), silicon (Si), nickel (Ni), magnesium (Mg), palladium (Pd), copper (Cu), and germanium (Ge). The material forming the back electrode 200 may be appropriately selected in consideration of a conductivity type of the back contact layer BC.

For example, when the back contact layer BC includes p-type impurities, the back electrode 200 may be formed of one selected from Au, Pt/Ti, W—Si alloy (WSi), and Si/Ni/Mg/Ni.

Further, when the back contact layer BC includes n-type impurities, the back electrode 200 may be formed of one selected from Pd/Au, Cu/Ge, Ni/Ge—Au alloy (GeAu)/Ni, and Au/Ti.

In addition, the material forming the back electrode 200 may be appropriately selected from among the above materials. In particular, the material of the back electrode 200 may be appropriately selected from among materials generating the low contact resistance between the back electrode 200 and the back contact layer BC.

The base layer BS and the emitter layer EM may be made of the same material having the same band gap to form homojunction. Alternatively, they may be made of different materials having different band gaps to form heterojunction.

Hereinafter, a method of manufacturing the compound semiconductor solar cell will be described with reference to FIG. 1 and FIG. 2.

The manufacturing method of the present invention includes forming a first mask layer M1 on a front surface of a compound semiconductor layer CS of a second region A2 which is a region other than a first region A1 where the front electrode 100 is to be formed (S10), forming a seed metal layer 100A on the front surface of the compound semiconductor layer CS of the first region A1 and on the first mask layer M1 of the second region A2 (S20), removing the seed metal layer 100A over the first mask layer M1 and the first mask layer M1 (S30), removing a part of the compound semiconductor layer CS of the second region A2 from the front surface of the compound semiconductor layer CS by using the seed metal layer 100A of the first region A1 as a mask (S40), forming a second mask layer M2 on the compound semiconductor layer CS of the second region A2 (S50), forming an electrode metal layer 100B on the seed metal layer 100A not covered by the second mask layer M2 (S60), and removing the second mask layer M2 (S70).

The compound semiconductor layer CS may be formed by forming a sacrificial layer on one side of a mother substrate serving as a base for providing a suitable lattice structure in which the compound semiconductor layer CS is formed, forming the compound semiconductor layer CS on the sacrificial layer, and separating the semiconductor layer from the mother substrate by removing the sacrificial layer using an epitaxial lift off (ELO) process.

The sacrificial layer and the compound semiconductor layer CS may be formed by a metal organic chemical vapor deposition (MOCVD) method, a molecular beam epitaxy (MBE) method, or any other appropriate method for forming an epitaxial layer.

At this time, the mother substrate has a size capable of manufacturing a plurality of compound semiconductor solar cells, and the compound semiconductor layer (CS) formed on the sacrificial layer of the mother substrate has the same size as the mother substrate.

Regarding the formation of the compound semiconductor layer CS, a regular growth method or an inverse growth method may be used.

The regular growth refers to a method of forming a compound semiconductor layer by sequentially forming from the back contact layer to the front contact layer on the sacrificial layer. When the compound semiconductor solar cell is manufactured using the regular growth method, the compound semiconductor layer is formed and then the ELO process is performed. Then, a back electrode is formed on the back contact layer, and a front electrode is formed on the front contact layer.

The inverse growth method refers to a method of forming a compound semiconductor layer by sequentially forming from the front contact layer to the back contact layer on the sacrificial layer. When a compound semiconductor solar cell is manufactured using the inverse growth method, after forming the compound semiconductor layer, a back electrode is formed on the back contact layer, an ELO process is performed, and then a front electrode is formed on the front contact layer.

Referring to a first drawing of FIG. 2, the back electrode 200 is formed on the back surface of the compound semiconductor layer CS and a carrier substrate 300 is bonded to the back surface of the back electrode 200.

According to the manufacturing method of the present invention, the first mask layer M1 is formed on the front surface of compound semiconductor layer CS in the state of the first drawing of FIG. 2 (S10).

The first mask layer M1 has an opening M1-1 that exposes a first region A1 in which the front electrode 100 is to be formed and covers the entire surface of the compound semiconductor layer CS of a second region A2 which is a region other than the first region A1 where the front electrode 100 is to be formed.

The first mask layer M1 may be formed using a conventional photoresist film and may be formed using an inkjet printing method or a screen printing method using a stencil mask.

After the first mask layer M1 is formed, the seed metal layer 100A is formed on the front surface of the compound semiconductor layer CS (S20).

The seed metal layer 100A may be formed by depositing any one material selected from the group consisting of palladium (Pd), nickel (Ni), titanium (Ti), platinum (Pt), and silver (Ag) or an alloy thereof to a thickness T1 of 5 nm to 100 nm by physical vapor deposition.

When the seed metal layer 100A is formed, the seed metal layer 100A is disposed on the front surface of the compound semiconductor layer CS of the first region A1 and on the first mask layer M1 of the second region A2.

After the seed metal layer 100A is formed, the first mask layer M1 is removed using an organic solvent containing acetone (S30).

When the first mask layer M1 is removed, the seed metal layer 100A positioned on the front surface of the first mask layer M1 is also removed.

Next, an etching process using the seed metal layer 100A as a mask is performed to remove the compound semiconductor layer CS by a certain thickness from the front surface of the compound semiconductor layer CS (S40).

The compound semiconductor layer CS may include the back contact layer BS, the back surface field layer BSF, the emitter layer EM, the base layer BS, the window layer WD and the front contact layer FC sequentially stacked from the back electrode 200 to the front electrode 100.

If the top layer of the compound semiconductor layer CS is the front contact layer FC, the front contact layer FC of the second area A2 is removed (S40).

When the front contact layer FC is formed of n-GaAs, the window layer WD directly contacting the back surface of the front contact layer FC is formed of a III-V group compound semiconductor containing phosphorus (P). For example, the window layer WD is formed of n-AlInP.

When the front contact layer FC is formed of n-GaAs and the window layer WD is formed of n-AlInP, the front contact layer FC can be removed by using a mixed solution of ammonia water ($NH_4OH$)/hydrogen peroxide ($H_2O_2$)/DI water or by using a mixture of phosphorous acid ($H_3PO_3$)/hydrogen peroxide ($H_2O_2$)/DI water.

When the front contact layer FC is removed using the mixed solution, the window layer WD functions as an etching stop layer.

Therefore, only the front contact layer FC of the second region A2 is effectively removed.

After the front contact layer FC of the second region A2 is removed, a second mask layer M2 is formed (S50).

The second mask layer M2 can be formed by printing the same material as the first mask layer M1 on the second region A2. For example, the second mask layer M2 may be formed of a photoresist film.

The second mask layer M2 has an opening M2-1 exposing the seed metal layer 100A and the width of the opening M2-1 is narrower than the width W1 of the seed metal layer 100A.

That is, the width of the opening M2-1 is formed to have the same width as the second width W2 of the electrode metal layer 100B shown in FIG. 3.

Therefore, the width of the opening M2-1 can be formed to 70% to 97% of the first width W1 of the seed metal layer 100A.

The second mask layer M2 is formed so as to cover both ends in the width direction of the seed metal layer 100A.

As described above, when the second mask layer M2 covers both ends in the width direction of the seed metal layer 100A, when the electrode metal layer 100B is formed by plating the copper, the compound semiconductor layer CS Can be prevented from dissolving After the second mask layer M2 is formed, an electrode metal layer 100B is formed on the front surface of the seed metal layer 100A exposed by the opening M2-1 (S60).

The electrode metal layer 100B can be formed by plating copper (Cu) to a thickness (T2) of 1 μm to 30 μm using a plating method.

At this time, the thickness T2 of the electrode metal layer 100B may be smaller than the thickness of the second mask layer M2.

When the electrode metal layer 100B is formed, since the compound semiconductor layer CS is covered with the second mask layer M2, the compound semiconductor layer CS is protected from the copper plating solution during formation of the electrode metal layer 100B.

After the electrode metal layer 100B is formed, the second mask layer M2 is removed by using an organic solvent containing acetone (S70). Then, the cover metal layer 100C including at least one of chromium (Cr), molybdenum (Mo), nickel (Ni), Silver (Ag), and titanium (Ti) is formed on the electrode metal layer 100B.

The cover metal layer 100C may be formed to cover the upper surface and side surfaces of the electrode metal layer 100B and prevent the oxide film from being formed on the surface of the electrode metal layer 100B formed of copper.

According to the method for manufacturing a compound semiconductor solar cell according to the present invention, the front contact layer FC positioned at the top of the compound semiconductor layer CS is patterned using the seed metal layer 100A as a mask before forming the electrode metal layer 100B on the seed metal layer 100A. Thus, it is possible to prevent a part of the electrode metal layer 100B from being etched in the process of patterning the front contact layer FC even if the electrode metal layer 100B is formed of copper (Cu) which is very cheap in material cost.

Since the second mask layer M2 for forming the electrode metal layer 100B covers both ends of the seed metal layer 100A in the width direction of the seed metal layer 100A, it is possible to prevent the compound semiconductor layer CS from being dissolved by the copper plating solution during the formation of the electrode metal layer 100B by plating the copper.

Therefore, there is an effect that the material of the electrode metal layer 100B of the front electrode 100 is made of copper, which is much cheaper in material cost than gold (Au), and the damage and performance deterioration of the compound semiconductor layer CS can be prevented.

Although the compound semiconductor solar cell has been described above as an example having single cell, the compound semiconductor solar cell may have a plurality of cells.

In this case, a middle cell or a bottom cell may include a GaAs-based compound semiconductor that absorbs light having a long wavelength band and performs photoelectric conversion, and a top cell may include a GaInP-based compound semiconductor that absorb light having a short wavelength band and performs photoelectric conversion. A tunnel junction layer may be disposed between the top cell and the middle cell and/or between the middle cell and the bottom cell.

Further, an intrinsic semiconductor layer may be further formed between the emitter layer and the base layer.

What is claimed is:

1. A method for fabricating a compound semiconductor solar cell, comprising:
   forming a first mask layer on a front surface of a compound semiconductor layer of a second region which is a region other than a first region where a front electrode is to be formed;
   forming a seed metal layer having a first width on the front surface of the compound semiconductor layer of the first region and on the first mask layer of the second region;
   removing the seed metal layer over the first mask layer and the first mask layer;
   removing a part of the compound semiconductor layer of the second region from the front surface of the compound semiconductor layer by using the seed metal layer of the first region as a mask;
   forming a second mask layer on the compound semiconductor layer of the second region and on both top surface edges of the seed metal layer in a width direction of the seed metal layer;
   forming an electrode metal layer having a second width less than the first width on the seed metal layer not covered by the second mask layer; and
   removing the second mask layer.

2. The method of claim 1, wherein in the step of forming the second mask layer, the second width of an opening exposing the seed metal layer is formed narrower than the first width of the seed metal layer.

3. The method of claim 2, wherein the second width of the opening is set to 70% to 97% of the first width of the seed metal layer, and the second width of the electrode metal layer is set to 70% to 97% of the first width of the seed metal layer.

4. The method of claim 1, wherein the seed metal layer is formed by depositing any one material selected from the group consisting of palladium (Pd), nickel (Ni), titanium (Ti), platinum (Pt), and silver (Ag) or an alloy thereof to a thickness of 5 nm to 100 nm by physical vapor deposition.

5. The method of claim 4, wherein the electrode metal layer is formed by plating copper (Cu) to a thickness of 1 μm to 30 μm by a plating method.

6. The method of claim 5, further comprising forming a cover metal layer including at least one of chromium (Cr), molybdenum (Mo), nickel (Ni), silver (Ag), and titanium (Ti) on the electrode metal layer.

7. The method of claim 5, wherein in the step of removing the compound semiconductor layer, a front contact layer which is in direct contact with the seed metal layer and located at the top of the compound semiconductor layer is removed.

8. The method of claim 6, wherein the front contact layer is formed of n-type or p-type GaAs.

9. The method of claim 8, wherein the front contact layer is removed by using a mixed solution of ammonia water ($NH_4OH$)/hydrogen peroxide ($H_2O_2$)/DI water or by using a mixture of phosphorous acid ($H_3PO_3$)/hydrogen peroxide ($H_2O_2$)/DI water.

10. The method of claim 9, wherein a window layer in direct contact with a back surface of the front contact layer is formed of a III-V compound semiconductor containing phosphide (P).

11. The method of claim 1, wherein in the step of forming the second mask layer, the second mask layer directly contacts the compound semiconductor layer at the second region.

12. The method of claim 1, wherein in the step of forming the second mask layer, the second mask layer overlaps and directly contacts both top surface edges of the seed metal layer.

* * * * *